United States Patent
Koto et al.

(10) Patent No.: US 9,536,753 B2
(45) Date of Patent: Jan. 3, 2017

(54) CIRCUIT SUBSTRATE INTERCONNECT

(71) Applicant: TEXAS INSTRUMENTS INCORPORATED, Dallas, TX (US)

(72) Inventors: Yohei Koto, Yokohama (JP); Kazunori Hayata, Minami-Alps (JP); Dan Okamoto, Oita (JP)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/504,971

(22) Filed: Oct. 2, 2014

(65) Prior Publication Data

US 2016/0099226 A1    Apr. 7, 2016

(51) Int. Cl.
*H01L 23/48* (2006.01)
*H01L 23/34* (2006.01)
(Continued)

(52) U.S. Cl.
CPC ........ *H01L 21/31111* (2013.01); *H01L 21/268* (2013.01); *H01L 21/565* (2013.01); *H01L 21/76802* (2013.01); *H01L 21/76877* (2013.01); *H01L 23/3107* (2013.01); *H01L 23/3135* (2013.01); *H01L 23/49517* (2013.01); *H01L 23/5386* (2013.01); *H01L 23/5389* (2013.01); *H01L 24/24* (2013.01); *H01L 24/73* (2013.01); *H01L 24/82* (2013.01); *H01L 24/92* (2013.01); *H01L 24/97* (2013.01); *H01L 24/05* (2013.01); *H01L 24/48* (2013.01); *H01L 24/85* (2013.01); *H01L 2224/04* (2013.01); *H01L 2224/04042* (2013.01); *H01L 2224/245* (2013.01); *H01L 2224/24226* (2013.01); *H01L 2224/48091* (2013.01); *H01L 2224/48227* (2013.01); *H01L 2224/73227* (2013.01); *H01L 2224/73265* (2013.01); *H01L 2224/73267* (2013.01);
(Continued)

(58) Field of Classification Search
CPC .............. H01L 21/268; H01L 21/31111; H01L 21/76877; H01L 25/0655; H01L 23/3107; H01L 23/3135; H01L 23/49517; H01L 23/5386; H01L 23/5389; H01L 24/24; H01L 24/73; H01L 24/82; H01L 24/92; H01L 24/97; H01L 24/05
USPC ........ 257/773, 730, 746, 712; 438/622, 121, 438/107
See application file for complete search history.

(56) References Cited

U.S. PATENT DOCUMENTS

| | | | |
|---|---|---|---|
| 2006/0019484 A1* | 1/2006 | Chen | H01L 21/486 438/618 |
| 2007/0197018 A1* | 8/2007 | Chen | H01L 21/486 438/618 |

(Continued)

*Primary Examiner* — Dzung Tran
(74) *Attorney, Agent, or Firm* — Jacqueline J. Garner; Charles A. Brill; Frank D. Cimino

(57) ABSTRACT

A packaged integrated circuit (IC) includes a substrate including a first substrate pad disposed on a first side of the substrate, an IC die disposed on the first side of the substrate, and a first insulating layer molded over the IC die and the substrate. The IC die includes a first die pad on a side of the die opposite from a side of the die adjacent to the first side of the substrate. The first insulating layer includes a first channel extending through the first insulating layer to the first substrate pad, a second channel extending through the first insulating layer to the first die pad, conductive paste filling the first channel and in contact with the first substrate pad, and conductive paste filling the second channel and in contact with the die pad.

13 Claims, 2 Drawing Sheets

(51) Int. Cl.
  *H01L 23/04*     (2006.01)
  *H01L 23/52*     (2006.01)
  *H01L 21/311*    (2006.01)
  *H01L 23/538*    (2006.01)
  *H01L 23/31*     (2006.01)
  *H01L 21/56*     (2006.01)
  *H01L 21/768*    (2006.01)
  *H01L 21/268*    (2006.01)
  *H01L 23/495*    (2006.01)
  *H01L 23/00*     (2006.01)

(52) U.S. Cl.
  CPC .............. *H01L 2224/8203* (2013.01); *H01L 2224/82104* (2013.01); *H01L 2224/92164* (2013.01); *H01L 2224/92244* (2013.01); *H01L 2224/92247* (2013.01); *H01L 2224/97* (2013.01); *H01L 2924/14* (2013.01); *H01L 2924/181* (2013.01); *H01L 2924/386* (2013.01)

(56) References Cited

U.S. PATENT DOCUMENTS

| | | | |
|---|---|---|---|
| 2008/0237879 A1* | 10/2008 | Yang | H01L 23/5389 257/774 |
| 2009/0039523 A1* | 2/2009 | Jiang | H01L 21/561 257/777 |
| 2010/0078655 A1* | 4/2010 | Yang | H01L 23/49816 257/81 |
| 2011/0298120 A1* | 12/2011 | Pagaila | H01L 23/3121 257/698 |
| 2012/0211892 A1* | 8/2012 | Kim | H01L 24/97 257/774 |

* cited by examiner

CIRCUIT SUBSTRATE INTERCONNECT

CROSS-REFERENCE TO RELATED APPLICATION

None.

BACKGROUND

In integrated circuit, or other semiconductor assembly, wire bonding is typically used to connect pads of a chip to a lead frame. In wire bonding, a wire interconnection is formed using a capillary, and the process starts by creating a ball at the end of the wire via electronic flame off. Thereafter, the ball is bonded to a first pad, and the wire is extended and boned to a second pad to electrically connect the pads.

SUMMARY

Systems and methods to form an interconnection between two pads are disclosed herein. In an embodiment, a packaged integrated circuit (IC) includes a substrate comprising a first substrate pad disposed on a first side of the substrate, an IC die disposed on the first side of the substrate, the die comprising a first die pad on a side of the die opposite from a side of the die adjacent to the first side of the substrate, and a first insulating layer molded over the IC die and the substrate. The first insulating layer includes a first channel extending through the first insulating layer to the first substrate pad, a second channel extending through the first insulating layer to the first die pad, conductive paste filling the first channel and in contact with the first substrate pad, and conductive paste filling the second channel and in contact with the die pad.

In another embodiment, a method for packaging an integrated circuit (IC) includes affixing an IC die to a package substrate, over-molding a first insulating layer over the IC die and the package substrate, forming a first passage from an outer surface of the first insulating layer to a first die pad of the die, forming a second passage from the outer surface of the first insulating layer to a first substrate pad of the substrate, and filling the first passage and the second passage with a conductive paste to electrically connect the first die pad and the first substrate pad to the outer surface of the insulating layer.

Yet in another embodiment, a circuit assembly includes a substrate comprising a plurality of substrate pads disposed on a first side of the substrate, a plurality of integrated circuit (IC) dies disposed on the first side of the substrate, each of the dies comprising a plurality of die pads on a side of the die opposite from a side of the die adjacent to the first side of the substrate, and a first insulating layer molded over the IC dies and the substrate. More specifically, the first insulating layer includes a first plurality of channels extending through the first insulating layer to the substrate pads, a second plurality of channels extending through the first insulating layer to the die pads, and conductive paste filling the first plurality of channels and the second plurality of channels to electrically connect the substrate pads and the die pads to an outer surface of the first insulating layer.

BRIEF DESCRIPTION OF THE DRAWINGS

For a detailed description of exemplary embodiments of the invention, reference will now be made to the accompanying drawings in which.

NOTATION AND NOMENCLATURE

Figure 1:
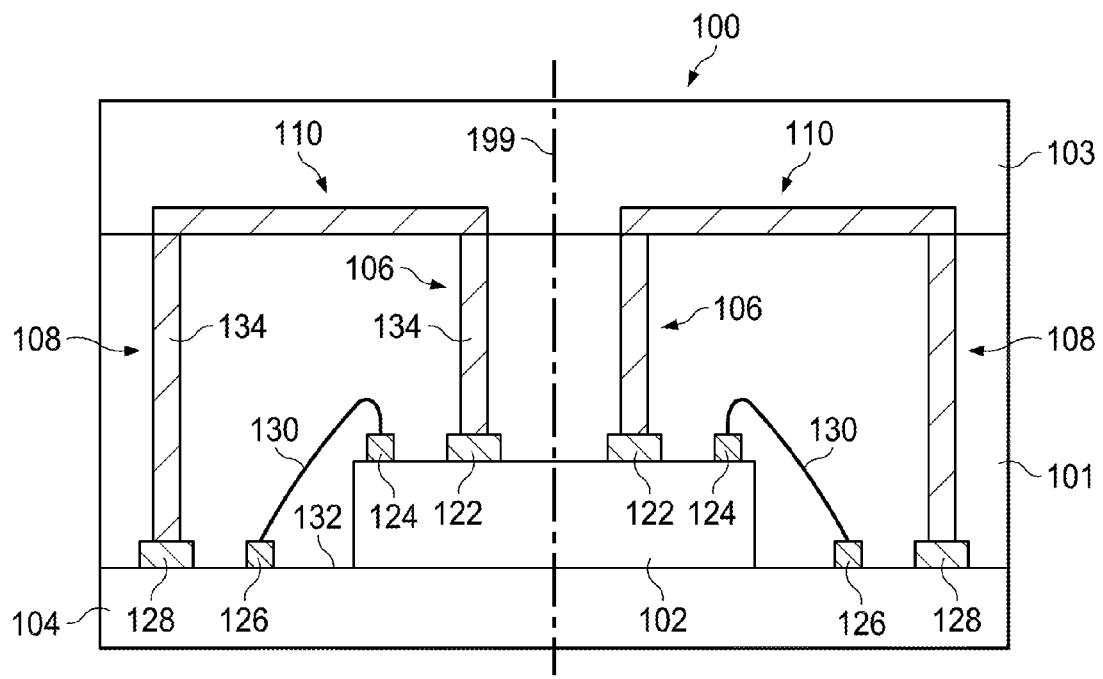
FIG. 1 shows a packaged integrated circuit (IC) including interconnections formed using a two-step over-molding method in accordance with various embodiments.

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . . " Also, the term "couple" or "couples" is intended to mean either an indirect or direct connection. Thus, if a first device couples to a second device, that connection may be through a direct connection, or through an indirect connection via other devices and connections.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

An interconnection between an integrated circuit (IC) die and a substrate may provide a path to distribute power and signal. One of the most frequently used technologies to provide such an interconnection is wire bonding. Wire bonding is commonly performed during a process to assemble a semiconductor such as an IC. Generally, wire bonding is referred to as a method of making interconnections between an IC die or other semiconductor device and packaging (e.g., a lead frame, a substrate) surrounding the die.

Conventionally, wire bonding is implemented via a capillary to cause a wire to extend from a first pad (e.g., a pad on an IC die) to a second pad (e.g., a pad on a substrate). The wire may have a very small diameter, for example, as small as 15 μm in diameter. More specifically, the wire bonding starts with the capillary forming an initial ball at the tip end of the capillary. The capillary descends to a distance close enough to the first pad so as to form a first bond at the first pad. Subsequently, the capillary is moved upward (i.e., ascend) and toward the second pad while feeding the wire in a looping operation. Finally, the wire is bonded to the second pad via the capillary.

While increasing demand for high-density IC packaging, a finer pad size may be required. As pad size shrinks, use of conventional wire bonding methods or apparatus may cause undesirable side effects such as shorting between bonding wires (i.e., a wire short). A wire short is generally described as an unintentional short of at least two wires that are intended to be electrically isolated. Moreover, as distance between pads decreases to accommodate thigh-density packaging, interference between the capillary and an existing bonded wire may occur. Such interference may result in wire shorts or wire breakage.

Embodiments disclosed herein apply a two-step over-molding process to form first and second insulating layers, thereby eliminating interference caused by the capillary. More specifically, embodiments form a wire via using a passage through the first insulating layer that may advantageously increase a robustness of an interconnection (i.e., wire) that is formed using the two-step over-molding process, especially when the diameter of the interconnection shrinks to a finer size (e.g., 15 µm).

FIG. 1 shows a packaged integrated circuit (IC) 100 to illustrate the disclosed interconnection between two pads in accordance with various embodiments. The packaged IC 100 includes a substrate 104, an IC die 102, first and second insulating layers 101 and 103, die pads 122 and 124, substrate pads 126 and 128, passages 106 and 108, and traces 110. The passages 106 and 108 are filled with a conductive material 134 (e.g., the same conductive material deposited to form traces 110).

The IC die 102 is generally deposited on a surface 132 of the substrate 104, and the substrate pads 126 and 128 are also deposited on the surface 132 of the substrate 104. The die pads 122 and 124 are preferably to be deposited on a surface of the IC die 102 which is opposite to a surface of the IC die 102 that is adjacent to the substrate 104.

Further, the packaged IC 100 includes a bonded wire 130 to interconnect the die pad 124 and the substrate pad 126. In a preferred embodiment, the bonded wire 130 may be formed using a capillary. Moreover, at the right/left side of dashed line 199, a distance between the die pad 124 and the substrate pad 126 may be less than a distance between the die pad 122 and the substrate pad 128. For clarity, the packaged IC 100 is shown in symmetry with respect to the dashed line 199.

In comparison with conventional wire bonding methods, the disclosed embodiments create multiple passages 106 and 108 through the insulating layers (e.g., the first and second insulating layers 101 and 103) formed by over-molding to interconnect two pads. By using such interconnections, the capillary may not be required to form bonded wires between two pads. Thus, the interference caused by the capillary may be avoided. More specifically, the passage 106 is formed through the first insulating layer 101 and extends from the die pad 122 to a surface of the first insulating layer 101. Similarly, the passage 108 is formed within the first insulating layer 101 as well but is configured to extend from the substrate pad 128 to the surface of the first insulating layer 101. The trace 110 is formed of a deposited conductive material, such as conductive paste. The trace 110 is deposited on the surface of the first insulating layer 101, and connects the passages 106 and 108, which in turn connects the pads 122 and 128 via conductive paste filling the passages 106 and 108. The second insulating layer 103 is deposited on the first insulating layer 101 so as to cover the trace 110. Each of the interconnections between the die pad 122 and the substrate pad 128 formed with the conductive paste is electrically isolated. Interconnections formed of conductive paste are also electrically isolated from the bonded wire 130.

Figure 2:
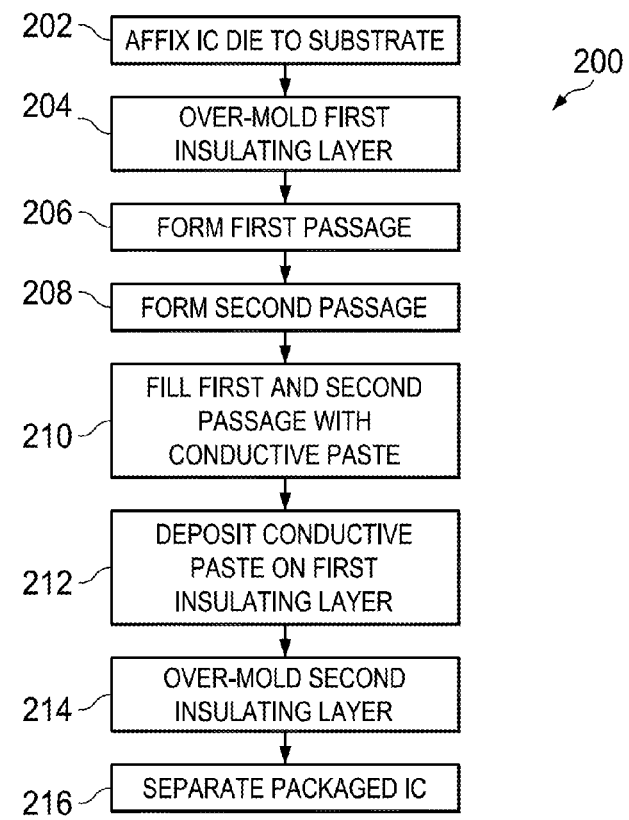
FIG. 2 shows a flow chart for a two-step over-molding method to form an interconnection between two pads in accordance with various embodiments.

FIG. 2 shows a flow chart for a method 200 for forming the interconnections between two pads in accordance with various embodiments. Through depicted sequentially as a matter of convenience, at least some of the actions shown may be performed in a different order and/or performed in parallel. Additionally, some embodiments may perform only some of the actions shown.

The method 200 starts in block 202 with affixing the IC die 102 to the package substrate 104. Multiple pads on the IC die 102 and the package substrate 104 respectively may be formed before or after the die 102 is affixed to the substrate 104. For example, the substrate pads 126 and 128 and the die pads 122 and 124 may be respectively formed before affixing the IC die 102 to the package substrate 104. Alternatively or additionally, the substrate pads 126 and 128 and the die pads 122 and 124 may be formed after the IC die 102 has been affixed to the package substrate 104.

After the IC die 102 is affixed to the package substrate 104 and preferably the pads (e.g., die pads 122 and substrate pads 128) are formed, the method 200 continues in block 204 with over-molding the first insulating layer 101 to cover the IC die 102, the pads (e.g., die pads 122, substrate pads 128), and the package substrate 104. Subsequently, in block 206, the method 200 continues with forming the first passage 106 from the outer surface of the first insulating layer 101 to the die pad 122 of the IC die 102. Preferably, forming the passage 106 is implemented using a vertical interconnect access (VIA) technology such as laser drilling, chemical etching, etc. The method 200 continues in block 208 with forming the second passage 108 from the outer surface of the first insulating layer 101 to the substrate pad 128. The second passage 108 may be formed using the aforementioned VIA technology.

Still referring to FIG. 2, the method 200 continues in block 210 with filling the first and second passages 106 and 108 with conductive paste so as to electrically connect the die pad 122 and the substrate pad 128 to the outer surface of the first insulating layer 101. In some embodiments, the conductive paste may include material such as copper, gold, and/or silver.

In order to electrically connect the die pad 122 and the substrate pad 128, the method 200 continues in block 212 with depositing the conductive paste on the first insulating layer 101 to form the trace 110. Further, the trace 110 is configured to electrically connect the conductive pastes filled in the passages 106 and 108. After the trace 110 is formed on the surface of the first insulating later 101, the method 200 continues in block 214 with over-molding the second insulating layer 214.

In accordance with some embodiments, the package substrate 104 may include more than one IC die affixed on the substrate. To individualize each IC die after its interconnections between the die pad and the substrate pad is formed, the flow chart 200 may further continues in block 216 with separating a packaged IC. The packaged IC may include the IC die 102, a portion of the package substrate 104, and the trace 110 from a different packaged IC formed on the package substrate 104. Details of the separation will be described with respect to the diagram in FIG. 3.

Further, prior to the over-molding of the first insulating layer 101 in block 204, the method 200 may include wire bonding the die pad 124 to the substrate pad 126. In some preferred embodiments, the wire bonding may be implemented using a capillary.

FIG. 3A-3E show operations 300 that illustrate steps to separate a single packaged IC from a common package substrate that includes multiple packaged ICs in accordance with various embodiments. The operations 300 start with step 302 in FIG. 3A. At step 302, the package substrate 104 includes three IC dies 102, 301, and 303 affixed on the substrate 104. Moreover, prior to forming interconnecting wires by using the disclosed embodiment, each IC die includes a bonded wire that connects a die pad on the IC die to a substrate pad on the substrate. For example, the IC die 102 includes wires 130; the IC die 301 includes wires 331; the IC die 303 includes wires 333. The wires 130, 331, and 333 may be formed by capillary facilitated wire bonding.

Figure 3A:
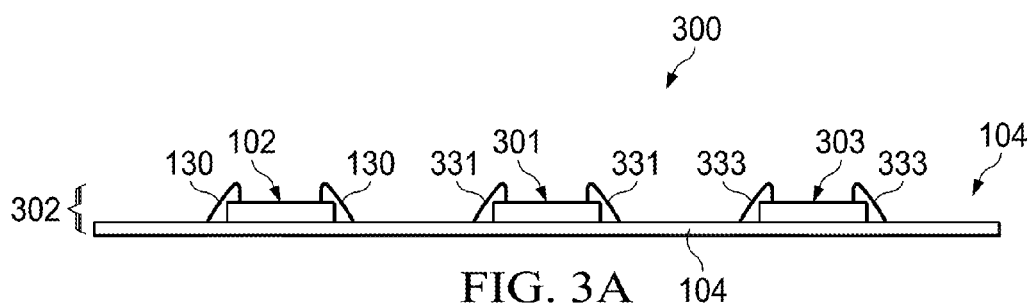
FIGS. 3A-3E show an example to illustrate separating a packaged integrated circuit (IC) from a common package substrate in accordance with various embodiments.
Figure 3B:
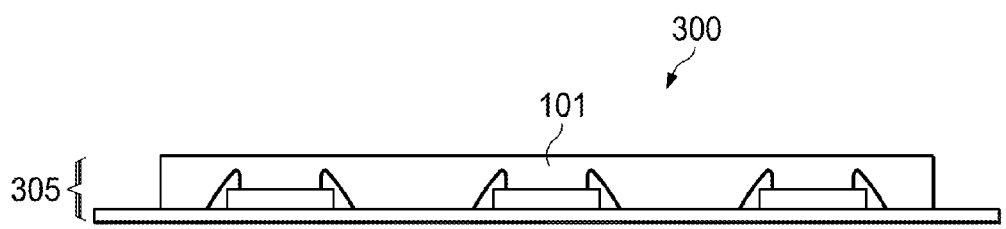
Figure 3C:
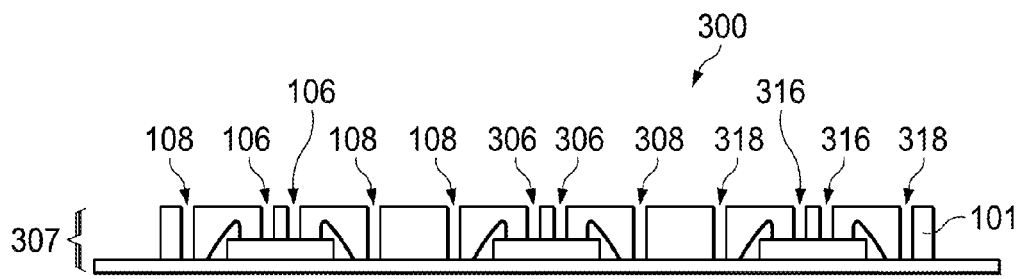

In step 305 of FIG. 3B, the first insulating layer 101 is formed to cover the IC dies 102, 301 and 303, the bonded wires 130, 331 and 333, and the package substrate 104. In step 307 of FIG. 3C, for each IC die, passages from the outer surface of the first insulating layer 101 to the die pads and substrate pads are formed respectively. More specifically, for the IC die 102, passages 106 are formed from the surface of the layer 101 to the die pads of the IC die 102, and passages 108 are formed from the surface of the layer 101 to the substrate pads of the substrate 104. Similarly, the passages 306 and 308 are formed for the IC die 301, and the passages 316 and 318 are formed for the IC die 303.

Figure 3D:
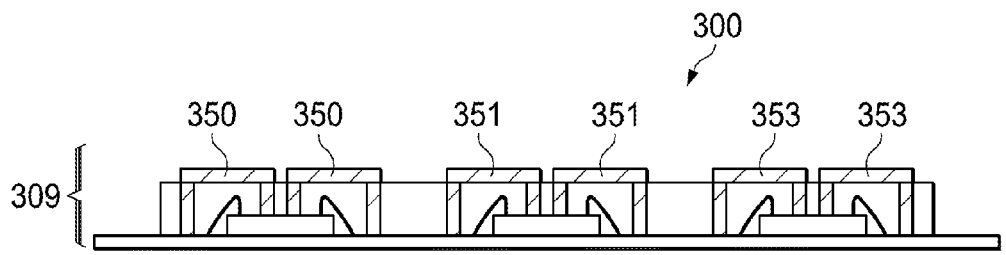

Referring to FIG. 3D, at step 309, the passages are filled with conductive paste, and conductive paste is deposited to form an associated trace that electrically connects the conductive paste filling the passages. As shown in step 309, the conductive paste 350 fills the passages 106 and 108 and further includes an associated trace deposited on the surface of the layer 101. The IC dies 301 and 303 also include the respective conductive pastes 351 and 353.

Figure 3E:
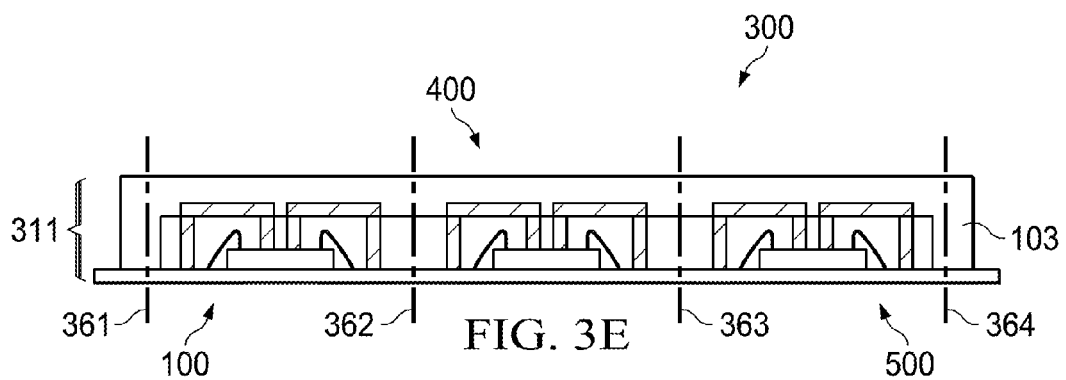

In step 311 of FIG. 3E, the second insulating layer 103 is deposited on the first insulating layer 101 and the conductive pastes 350, 351, and 353. The second insulating layer 103 electrically isolates the conductive pastes 350, 351 and 353 from further packaging steps. Moreover, to individualize each packaged IC, in step 311, the packaged ICs are separated (e.g., along dashed lines 361, 362, 363, and 364) using a singulation process such as sawing, laser cutting, etc.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A packaged integrated circuit (IC), comprising:
   a substrate comprising a first substrate pad on a first side of the substrate;
   an IC die on the first side of the substrate, the IC die comprising a first die pad on a side of the IC die opposite from a side of the IC die adjacent to the first side of the substrate;
   a first insulating layer over the IC die and the substrate, the first insulating layer comprising:
      a first channel extending through the first insulating layer to the first substrate pad;
      a second channel extending through the first insulating layer to the first die pad;
      a conductive material filling the first channel and in contact with the first substrate pad; and
      the conductive material filling the second channel and in contact with the first die;
   a third substrate pad on the first side of the substrate;
   a third die pad on the first side of the IC die; and
   a wire bonded to the third substrate pad and the third die pad, wherein the wire is within the first insulating layer.

2. The IC of claim 1, further comprising a first conductive trace formed of the conductive material on the first insulating layer, wherein the first conductive trace electrically connects the first channel to the second channel and the first substrate pad to the first die pad.

3. The IC of claim 2, further comprising a second insulating layer over the first insulating layer and the first conductive trace.

4. The IC of claim 2, further comprising:
   a second substrate pad on the first side of the substrate;
   a second die pad on the first side of the die; and
   a second conductive trace formed of the conductive material on the first insulating layer; wherein the second conductive trace electrically connects the second substrate pad to the second die pad, and the second conductive trace is electrically isolated from the first conductive trace.

5. The IC of claim 1, wherein a distance from the first substrate pad to the first die pad is greater than a distance from the third substrate pad to the third die pad.

6. A circuit assembly, comprising:
   a substrate comprising a first plurality of substrate pads and a second plurality of substrate pads on a first side of the substrate;
   a plurality of integrated circuit (IC) dies on the first side of the substrate, each of the dies comprising a first plurality of die pads and a second plurality of die pads;
   a plurality of bond wires connecting the second plurality of die pads to the second plurality of substrate pads, wherein a distance between the second plurality of die pads and the second plurality of substrate pads is less than a distance between the first plurality of die pads and the first plurality of substrate pads; and
   a first insulating layer over the plurality of IC dies and the substrate, and comprising:
      a first plurality of channels extending through the first insulating layer to the first plurality of substrate pads;
      a second plurality of channels extending through the first insulating layer to the first plurality of die pads; and
      conductive material filling the first plurality of channels and the second plurality of channels to electrically connect the first plurality of substrate pads and the first plurality of die pads to an outer surface of the first insulating layer.

7. The circuit assembly of claim 6, further comprising a plurality of conductive traces deposited on the outer surface of the first insulating layer, each of the conductive traces electrically connecting one of the first plurality of channels to one of the second plurality of channels, and one of the first plurality of substrate pads to one of the first plurality of die pads; wherein each of the plurality of conductive traces are formed of the conductive material.

8. The circuit assembly of claim 7, wherein each of the plurality of conductive traces is electrically isolated from each other of the conductive traces.

9. The circuit assembly of claim 7, further comprising a second insulating layer over the first insulating layer and the plurality of conductive traces.

10. The IC of claim 1, wherein the first die pad and the first substrate pad are located between the third die pad and the third substrate pad.

11. A packaged integrated circuit (IC), comprising:
    a substrate comprising a first substrate pad on a first side of the substrate;
    an IC die on the first side of the substrate, the IC die comprising a first die pad on a side of the IC die opposite from a side of the IC die adjacent to the first side of the substrate;

a first insulating layer over the IC die and the substrate, the first insulating layer comprising:
  a first channel extending through the first insulating layer to the first substrate pad;
  a second channel extending through the first insulating layer to the first die pad;
  a conductive material filling the first channel and in contact with the first substrate pad; and
  the conductive material filling the second channel and in contact with the first die pad;
a second substrate pad on the first side of the substrate;
a second die pad on the first side of the IC die;
a wire bonded to the second substrate pad and the second die pad, wherein the wire is within the first insulating layer; and
a first conductive trace having the conductive material, the first conductive trace on the first insulating layer, wherein the first conductive trace electrically connects the first channel to the second channel and the first substrate pad to the first die pad.

12. The IC of claim 11, further comprising a second insulating layer over the first insulating layer and the first conductive trace.

13. The IC of claim 11, further comprising:
a third substrate pad on the first side of the substrate;
a third die pad on the first side of the die; and
a second conductive trace having conductive material, the second conductive trace on the first insulating layer; wherein the second conductive trace electrically connects the third substrate pad to the third die pad, and the second conductive trace is electrically isolated from the first conductive trace.

* * * * *